US010485146B2

(12) United States Patent
Daskalos et al.

(10) Patent No.: US 10,485,146 B2
(45) Date of Patent: Nov. 19, 2019

(54) ENVIRONMENTAL CONTROL FOR MEDIUM-VOLTAGE DRIVE

(71) Applicant: Toshiba International Corporation, Houston, TX (US)

(72) Inventors: Michael C. Daskalos, Magnolia, TX (US); John D. Kleinecke, Wichita Falls, TX (US)

(73) Assignee: Toshiba International Corporation, Houston, TX (US)

( * ) Notice: Subject to any disclaimer, the term of this patent is extended or adjusted under 35 U.S.C. 154(b) by 447 days.

(21) Appl. No.: 15/166,366

(22) Filed: May 27, 2016

(65) Prior Publication Data
US 2017/0347501 A1   Nov. 30, 2017

(51) Int. Cl.
*H05K 7/20*   (2006.01)
*G05B 19/05*  (2006.01)

(52) U.S. Cl.
CPC ......... *H05K 7/20945* (2013.01); *G05B 19/05* (2013.01); *H05K 7/20209* (2013.01); *H05K 7/20909* (2013.01)

(58) Field of Classification Search
CPC . H05K 7/20945; H05K 7/20909; G05B 19/05
See application file for complete search history.

(56) References Cited

U.S. PATENT DOCUMENTS

| 6,104,003 | A  | * | 8/2000  | Jones    | F26B 21/06  |
|           |    |   |         |          | 165/104.33  |
| 6,127,663 | A  | * | 10/2000 | Jones    | F26B 21/06  |
|           |    |   |         |          | 219/209     |
| 6,481,635 | B2 |   | 11/2002 | Riley et al. | |
| 6,508,303 | B1 |   | 1/2003  | Naderer  | |
| 7,726,144 | B2 | * | 6/2010  | Larson   | G05D 23/1931|
|           |    |   |         |          | 62/259.2    |
| 8,214,086 | B2 | * | 7/2012  | Thompson | G06F 1/206  |
|           |    |   |         |          | 700/275     |
| 8,976,526 | B2 | * | 3/2015  | Kulkarni | H02M 7/003  |
|           |    |   |         |          | 307/10.6    |
| 9,153,374 | B2 | * | 10/2015 | Kulkarni | H05K 7/1432 |
| 9,363,930 | B2 | * | 6/2016  | Kulkarni | H05K 7/20936|

(Continued)

OTHER PUBLICATIONS

Office Action issued in related Canadian application No. 2,966,104, dated Mar. 12, 2018 (6 pages).

*Primary Examiner* — Charles R Kasenge
(74) *Attorney, Agent, or Firm* — Baker Botts L.L.P.

(57) ABSTRACT

In accordance with presently disclosed embodiments, a system and method for controlling the temperature of medium-voltage power electronics assemblies (i.e., medium-voltage drives) is provided. The disclosed system generally includes a medium-voltage drive having one or more cabinets with power electronics devices disposed therein, one or more fans for circulating air through the cabinet to cool the devices, and one or more space heaters disposed in the cabinet. The drive also features temperature sensors used to measure various temperatures of the drive, a controller communicatively coupled to the sensors, and one or more variable frequency drives (VFD) for the fans. The controller may receive measurements regarding the ambient and power device temperatures and apply controls to vary the space heater power and fan speed in response to environmental changes.

17 Claims, 3 Drawing Sheets

(56) References Cited

U.S. PATENT DOCUMENTS

| | | | |
|---|---|---|---|
| 2003/0197004 A1 | 10/2003 | Krieger et al. | |
| 2004/0252458 A1* | 12/2004 | Arai | G06F 1/206 361/695 |
| 2005/0006085 A1* | 1/2005 | Nelson | G06F 1/206 165/299 |
| 2005/0078451 A1* | 4/2005 | Sauciuc | G06F 1/20 361/700 |
| 2005/0174737 A1* | 8/2005 | Meir | G06F 1/20 361/697 |
| 2005/0231912 A1* | 10/2005 | Arai | G06F 1/206 361/695 |
| 2007/0046230 A1* | 3/2007 | Tsutsui | G06F 1/203 318/268 |
| 2007/0047199 A1* | 3/2007 | Tsutsui | G06F 1/203 361/679.48 |
| 2007/0098374 A1* | 5/2007 | Fujiwara | G06F 1/203 388/811 |
| 2011/0159795 A1 | 6/2011 | Sprague et al. | |
| 2011/0224837 A1* | 9/2011 | Moss | G06F 1/206 700/295 |
| 2011/0245976 A1* | 10/2011 | Thompson | G06F 1/206 700/275 |
| 2012/0224976 A1* | 9/2012 | Nagamatsu | G06F 1/206 417/1 |
| 2012/0327602 A1* | 12/2012 | Kulkarni | H02M 7/003 361/700 |
| 2013/0054047 A1* | 2/2013 | Uhlmann | G06F 1/206 700/300 |
| 2013/0205151 A1* | 8/2013 | Hsiao | G06F 1/206 713/323 |
| 2013/0344794 A1* | 12/2013 | Shaw | G06F 1/206 454/258 |
| 2014/0036445 A1* | 2/2014 | Okamoto | H05K 7/20209 361/697 |
| 2014/0069909 A1* | 3/2014 | Tang | H05B 1/0227 219/498 |
| 2014/0124163 A1* | 5/2014 | Campbell | F24T 10/30 165/45 |
| 2014/0124164 A1* | 5/2014 | Campbell | F24T 10/30 165/45 |
| 2014/0252864 A1* | 9/2014 | Kulkarni | H05K 7/20936 307/82 |
| 2015/0003015 A1* | 1/2015 | Kulkarni | H05K 7/1432 361/700 |
| 2016/0324338 A1* | 11/2016 | Brija | F21V 33/0036 |

* cited by examiner

ENVIRONMENTAL CONTROL FOR MEDIUM-VOLTAGE DRIVE

TECHNICAL FIELD

Embodiments of the present disclosure relate to medium-voltage drives and, more particularly, to an environmental control system and method for use in outdoor medium-voltage drives.

BACKGROUND

Medium-voltage (e.g., greater than 1500 volts) power electronics assemblies, such as adjustable speed drives, often use groups of power transistors and diodes switched on and off in a predetermined timing sequence to supply the level and frequency of power desired. Because of the high voltage levels in which they operate (e.g., 2400 volts, 3300 volts, 4160 volts, 6600 volts, etc.), and the associated levels of current, these devices tend to generate significant amounts of excess heat.

It is desirable to dissipate the excess heat generated by such medium-voltage drives throughout their operation. Known methods for dissipating the excess heat involve using a fan to draw air through the cabinet housing the power devices of the medium-voltage drive. Doing so, however, results in airborne contaminants being deposited on the power devices such that, over time, the devices will require maintenance and/or cleaning. The contaminants may also interfere with the operation of the devices, or may cause even more heat to build up (e.g., as the contaminants may tend to trap heat) and reduce the lifespan of the devices. Controlling the operating environment of the power devices becomes even more complicated when the medium-voltage drives are housed in outdoor units and exposed to extreme cold ambient conditions.

SUMMARY

In accordance with the above, presently disclosed embodiments are directed to a system and method for controlling the temperature of medium-voltage power electronics assemblies (i.e., medium-voltage drives). The system and method may be particularly useful in outdoor medium-voltage drives that are exposed to very cold ambient temperatures. The disclosed system generally includes a medium-voltage drive having one or more cabinets with power electronics devices disposed therein, one or more fans for circulating air through the cabinets or heatsinks to cool the devices, and one or more space heaters disposed in the cabinet. The medium-voltage drive also features temperature sensors used to measure various temperatures (e.g., ambient temperature, device temperature, coolant temperature) of the drive, a controller (e.g., programmable logic controller) communicatively coupled to the sensors, and one or more variable frequency drives (VFD) for the one or more fans. The controller outputs control signals to the VFD and the one or more space heaters to adjust a temperature of the medium-voltage drive as needed to keep the drive and components within a desired operating temperature range. The controller may receive measurements regarding the ambient and power device temperatures and apply controls to vary the space heater power and fan speed in response to environmental changes.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
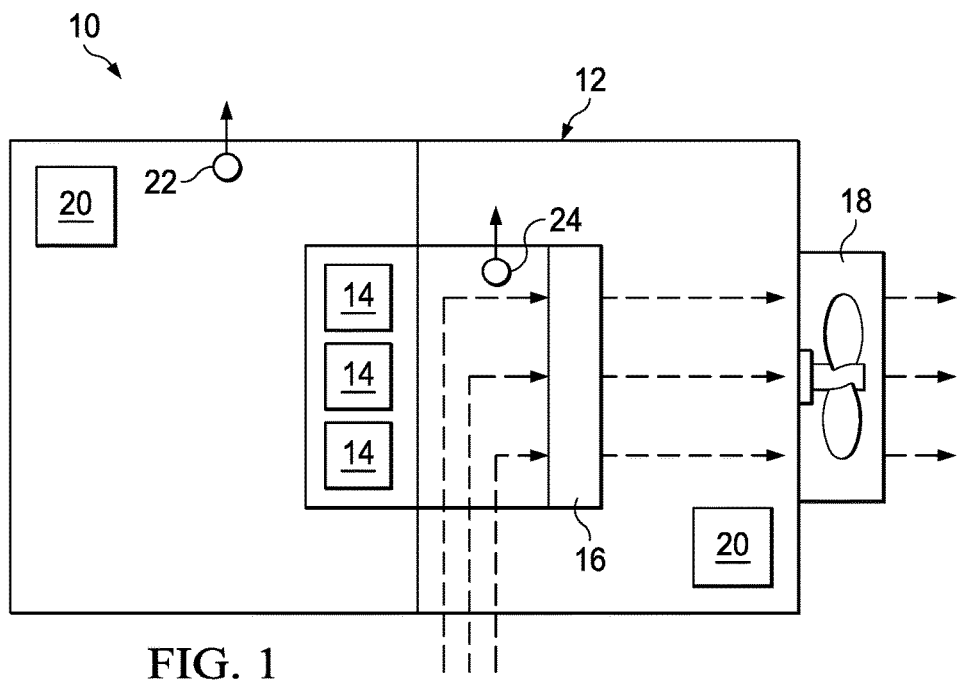
FIG. 1 is a schematic diagram illustrating a medium-voltage drive, in accordance with an embodiment of the present disclosure.

Illustrative embodiments of the present disclosure are described in detail herein. In the interest of clarity, not all features of an actual implementation are described in this specification. It will of course be appreciated that in the development of any such actual embodiment, numerous implementation specific decisions must be made to achieve developers' specific goals, such as compliance with system related and business related constraints, which will vary from one implementation to another. Moreover, it will be appreciated that such a development effort might be complex and time consuming, but would nevertheless be a routine undertaking for those of ordinary skill in the art having the benefit of the present disclosure. Furthermore, in no way should the following examples be read to limit, or define, the scope of the disclosure.

Medium-voltage drives often include groups of power transistors and diodes switched on and off in a predetermined timing sequence to supply the level and frequency of power desired. These medium-voltage drives are sometimes located in a cabinet positioned outdoors. Outdoor medium-voltage drives often utilize space heaters to heat the cabinet during extreme cold conditions as well as fans to cool the power devices therein. In existing systems, control of the space heaters and fans is typically simple, such that the space heaters are turned on when the drive is off/cold and the fans run constantly at one speed whenever the drive is running/hot. However, this type of temperature control can cause large temperature swings of the power devices, which can lead to inefficient operation or damage to the power devices. The existing temperature control methods can also reduce the cooling capabilities of single-phase and two-phase heat sinks coupled to the power devices.

The disclosed environmental control system and method are designed to overcome these drawbacks associated with existing systems. The environmental control system may include a controller that uses signals received from device temperature sensors and ambient temperature sensors to determine and output control signals to one or more variable frequency drives (VFD) for the cooling fan or fans and to one or more space heaters disposed in the cabinet. The disclosed environmental control system and method may provide more gradual temperature adjustments within the drive system to prevent large temperature swings, as compared to existing control systems. The environmental control system and method may provide reliable temperature control by varying both fan speed and space heater operating power to maintain the power devices within a desired temperature range. The fan may be operated at a speed just fast enough to keep the electronics within a preferred temperature range while reducing the amount of debris pulled into the drive cabinet or heatsinks, thus reducing the need for periodic cleaning. This may keep the drive power devices operating more efficiently and longer than would be available with a single speed fan.

Turning now to the drawings, FIG. 1 is a schematic block diagram of a medium-voltage drive system 10 in accordance with the disclosed embodiments. The medium-voltage drive system 10 may be an indoor or outdoor unit. The medium-voltage drive system 10 may include a cabinet 12 (or enclosure) housing a group of power devices 14. These power devices 14 may include, for example, power transistors and diodes designed to be switched on and off in a predetermined timing sequence to supply a desired level and frequency of power. In some embodiments, the devices 14 may be attached to a heat sink 16 as shown. The heat sink 16 may be used to help cool the power devices 14. The heat sink 16 may be any desirable type of heat sink including, but not limited to, a simple heat conductive metal heat sink, a liquid cooled single phased heat sink, or a boiling type two phase heat sink.

In addition to the heat sink 16, the medium-voltage drive system 10 includes a fan assembly 18 that may be used to draw air through the cabinet 12, the heatsink 16, or both to dissipate the excess heat generated by the power devices 14, thereby cooling the devices 14. The fan assembly 18 may include one or more fans for directly or indirectly (e.g., via heat sink 16) cooling the devices 14. The medium-voltage drive system 10 is designed for effective operation in extremely cold environments. To that end, the medium-voltage drive system 10 includes one or more space heaters 20 disposed within the cabinet 12. The space heaters 20 may be operated by running an electric current through high resistance heating elements. In some embodiments, the space heaters 20 may include fans that help distribute heat from the heating elements to the cabinet 12. The one or more space heaters 20 may be turned on and controlled to increase the ambient temperature within the cabinet 12. This heating of the cabinet 12 may enable effective operation, and in extreme cases, prevent low temperature failure of, the power devices 14 and the attached heat sink 16 when the medium-voltage drive 10 is exposed to very cold outdoor temperatures.

As illustrated, at least one ambient temperature sensor 22 and at least one device temperature sensor 24 may be disposed within the cabinet 12 of the medium-voltage drive 10. The ambient temperature sensor 22 may be used to detect a temperature of the ambient air within the cabinet 12, while the device temperature sensor 24 may be positioned to detect a temperature of the power devices 14. In some embodiments, another temperature sensor (not shown) may be coupled to a portion of the heat sink 16, such as a sensor used to measure a temperature of coolant being cycled through the heat sink 16 to cool the devices 14. Each of the temperature sensors 22 and 24 of the medium-voltage drive 10 may be communicatively coupled to a controller, as described in greater detail below. The controller may utilize the temperature measurements to execute improved control over the operation of the one or more fans in the fan assembly 18 as well as the one or more space heaters 20.

Figure 2:
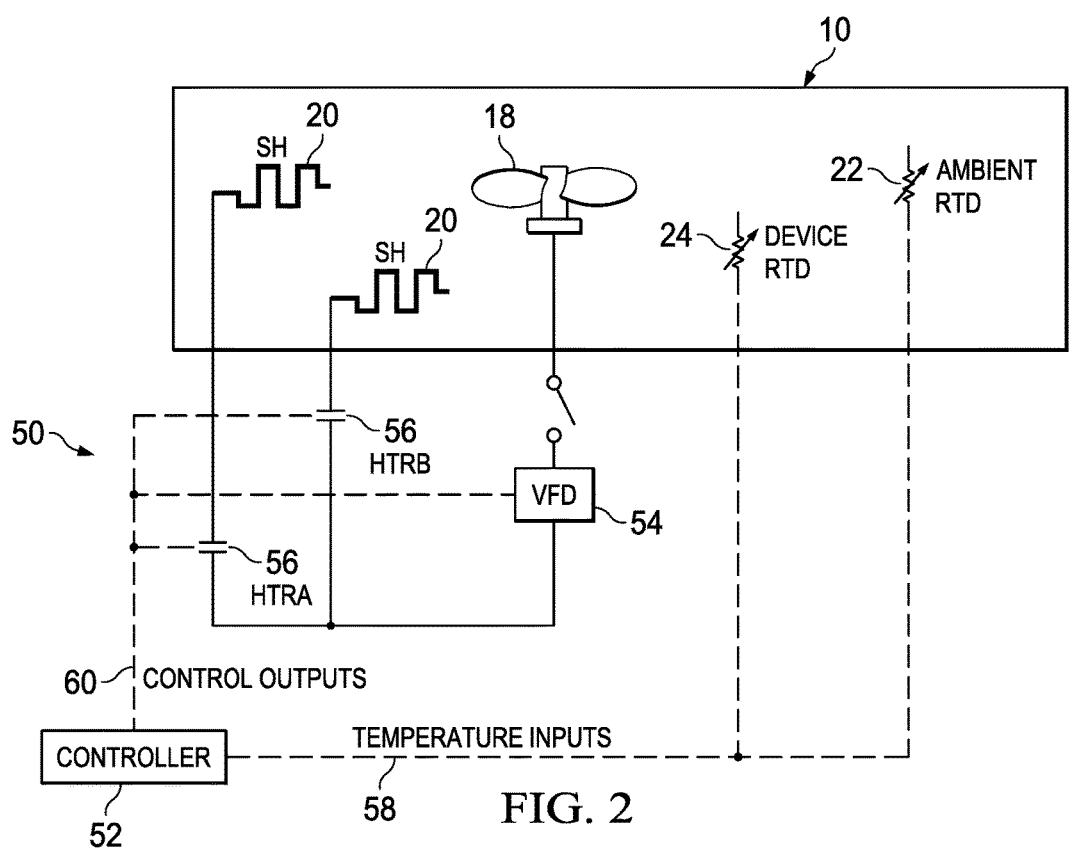
FIG. 2 is a schematic diagram illustrating the associated environmental control system, in accordance with an embodiment of the present disclosure.

FIG. 2 is a detailed schematic of an environmental control system 50 that may be used to control the temperature of various components within the medium-voltage drive 10 of FIG. 1. The environmental control system 50 may include at least one fan 18, the space heaters 20, the ambient temperature sensor 22, the device temperature sensor 24, and a controller 52. The ambient and device temperature sensors 22 and 24 may each include a resistance temperature detector (RTD). In the disclosed embodiment, the fan 18 may be coupled to a variable frequency drive (VFD) 54, which is used to selectively vary the rotational speed of the fan 18 and, thus, the speed of air moving through the cabinet 12. When multiple fans 18 are used, each may be coupled to a separate VFD 54 for selectively varying the speeds of the fans 18.

Each of the space heaters 20 may be coupled to a corresponding heater power control component 56 that is used to vary the amount of heat output from the space heater 20. For example, based on a control signal received at the heater power control 56, the heater power control 56 may operate the corresponding space heater 20 at one of a number of available heater power levels. For example, the space heaters 20 may be designed to work at a low, medium, and high heat level, based on the setting of the heater power control 56. The heater power control 56 may facilitate changes in the amount of heat output from the space heater 20, for example, by varying an amount of electric current flowing through the heating element of the space heater 20. A fan (not shown) may be added to help circulate the heat through the cabinet.

As illustrated, the controller 52 is communicatively coupled to both the ambient temperature sensor 22 and the device temperature sensor 24. The controller 52 receives temperature input signals 58 from these sensors 22 and 24. The controller 52 may also be communicatively coupled to the VFD 54 of the fan assembly 18 and the heater power control components 56 used for each space heater 20 in the medium-voltage drive 10. The controller 52 may provide control output signals 60 to the VFD 54 and the heater power controls 56 to adjust a temperature within the medium-voltage drive 10. The controller 52 may measure the ambient and power device temperatures via sensors 22 and 24 and apply control signals to the space heater power components 56 and the fan VFD 54 in response to environmental changes detected through the temperature measurements. The controller 52 may output signals for independently controlling operation of the one or more cooling fans 18 and the space heaters 20 in the medium-voltage drive 10.

Figure 3:
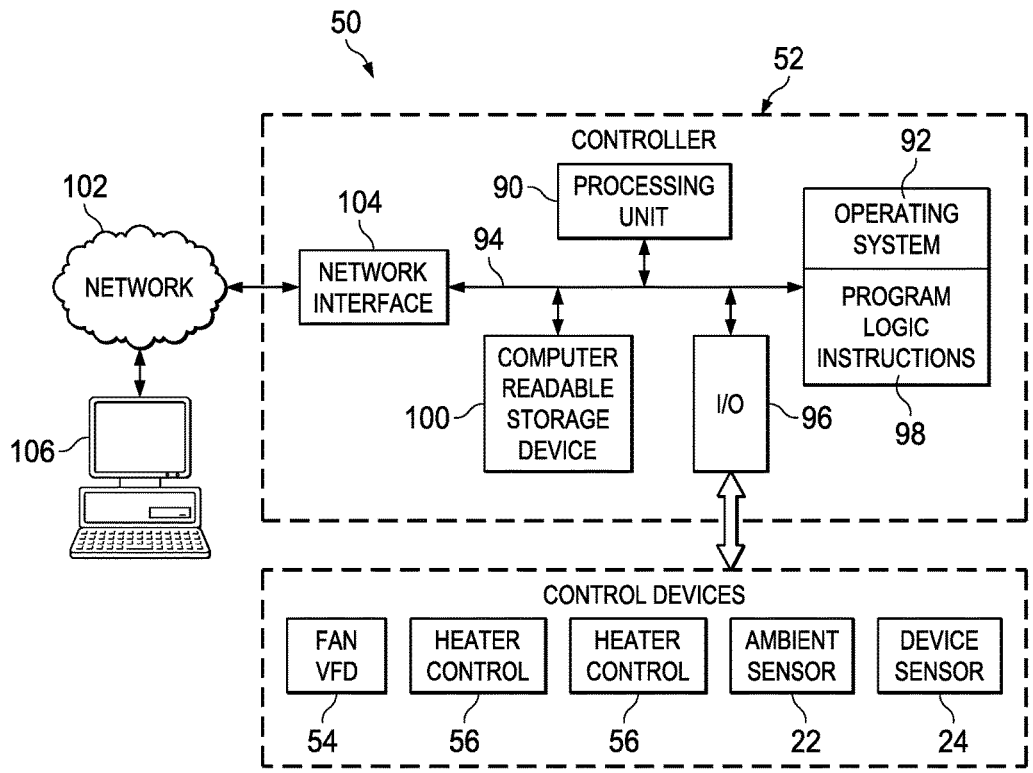
FIG. 3 is a schematic diagram illustrating the environmental control system of FIG. 2, in accordance with an embodiment of the present disclosure.

FIG. 3 illustrates a more detailed view of the controller 52 described above. As illustrated, the controller 52 may include a computing device for controlling the operation of the fan assembly 18 (via the VFD 54) and one or more space heaters 20 in the medium-voltage drive 10. In some embodiments, the controller 52 may include a programmable logic controller (PLC). In other embodiments, the controller 52 may have aspects of a general purpose computer configured to operate in a manner similar to or in combination with a PLC. In one programmed arrangement, the controller 52 may vary the speed of the fan 18 and vary the heating power of the space heaters 20 in response to ambient and/or device temperature measurements.

Hardware components of the controller 52 may include a processing unit 90, a system memory 92, and a system backplane 94 that forms a data pathway for an input/output interface 96. The input/output interface 96 may communicate with various control devices, such as the VFD 54, the heater controls 56, the ambient temperature sensor 22, and the device temperature sensor 24. The processing unit 90 may be a suitable microprocessor used in industrial control systems. The system backplane 94 may be any of several types of conventional backplane structures. The system memory 92 may include computer readable code in the form of read only memory (ROM) and random access memory (RAM). The system memory 92 may store programmable instructions of operational logic sequences 98 that are executed by the processing unit 90.

The controller 52 may further include a computer readable storage device 100 that may comprise an Eraseable Programmable Read Only Memory (EPROM), Electrically Eraseable Programmable Read Only Memory (EEPROM), or battery backed-up RAM. The storage device 100 and associated computer-readable media provide nonvolatile storage of computer readable code and operational logic sequences 98. Nevertheless, various operational logic sequences for the environmental control system 50 may be readily programmed into the controller 52. In a further arrangement, the controller 52 may operate in a networked environment 102 using a network interface 104. The networked environment 102 may include a local area network (LAN) and any number of networking signaling protocols used in conventional industrial control systems. For example, the controller 52 may be configured with an operative connection to an internet protocol (IP) network which enables access for devices on the World Wide Web. This may allow operating data to be viewed from a remote location using a computer terminal 106 running a conventional web browser.

A control operation provided by the disclosed environmental control system 50 may allow the fan speed of the fan 18 to be varied based on the detected ambient/device temperatures and the space heaters to be incrementally powered up in response to lower detected ambient temperatures. To facilitate these features, the present disclosure provides a computer implemented operation for the VFD 54 of the fan assembly 18 and the one or more space heaters 20 in the medium-voltage drive 10. Operational logic may be described in the general context of computer-executable instructions, such as program modules, executed by one or more computing devices, such as the controller 52. Generally, program modules may include routines, programs, objects, components, data structures, or ladder logic that perform particular tasks or implement particular data types.

Figure 4:
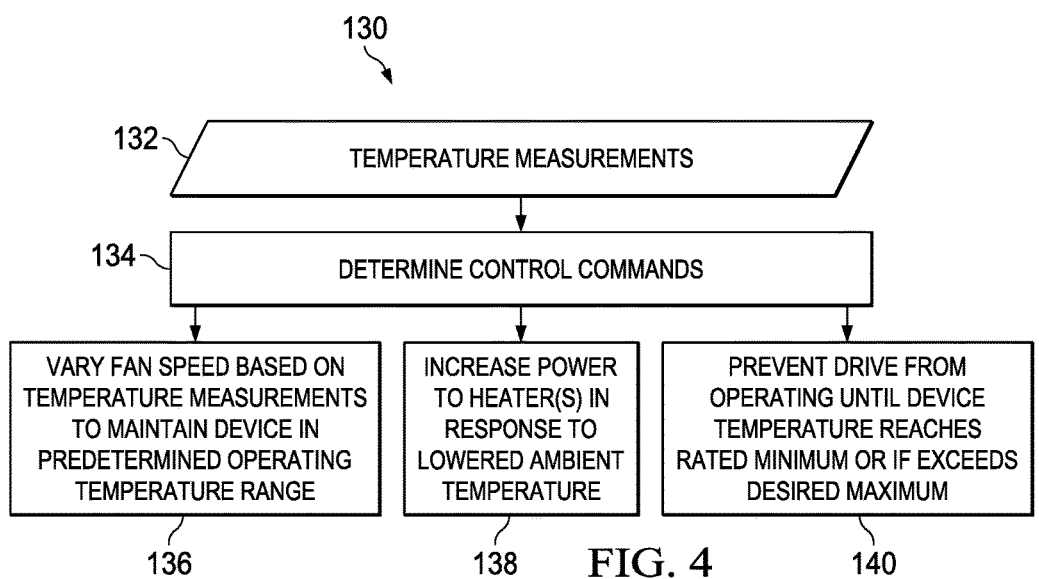
FIG. 4 is a process flow diagram of a method for operating the environmental control system of FIG. 2, in accordance with an embodiment of the present disclosure.

FIG. 4 illustrates a method 130 for controlling the operation of the fan VFD 54 and one or more space heaters 20 of the medium-voltage drive 10 described above. It should be noted that certain parts of the method 130 may be implemented as a computer or software program (e.g., code or instructions) that may be executed by the processing unit 90 in the controller 52 to execute one or more of the steps of the method 130. Additionally, the program (e.g., code or instructions) may be stored in any suitable article of manufacture that includes at least one tangible non-transitory, computer-readable medium that at least collectively stores these instructions or routines, such as the system memory 92 or the storage device 100 in the controller 52. It should be noted that additional steps (or fewer steps) may be implemented in other embodiments of the environmental control method 130, and some of the illustrated steps may be combined together or performed in different orders than as shown.

The method 130 includes receiving temperature measurements 132 at the processing unit 90 from the ambient temperature sensor 22, the device temperature sensor 24, and/or any other sensors within the medium-voltage drive system 10. As described with reference to FIG. 2, these temperature measurements 132 may be communicated as temperature inputs 58 to the controller 52. The method 130 may then include determining, based on the received temperature measurements 132, one or more control commands 134 to output to the various control components of the environmental control system 50. Specifically, the method 130 involves determining control commands 134 to send to the fan VFD 54 as well as the one or more heater control components 56 of the environmental control system 50. In some embodiments, the control commands 134 may be to adjust (i.e., increase or decrease) a speed of the fan 18 via the VFD 54, to adjust (i.e., increase or decrease) the amount of heating power output from the space heaters 20 within the cabinet 12 of the medium-voltage drive 10, or both. Since the fan 18 and the space heaters 20 are independently operated, the control commands 134 may be to run both the fan 18 and one or more space heaters 20 at the same time.

Based on the determined control commands, the environmental control system 50 may vary a fan speed (block 136) of the fan 18 (using the VFD 54) based on the temperature measurements 132 to maintain the power devices 14 of the medium-voltage drive 10 in a predetermined operating temperature range. That is, the system may control the device-cooling fan speed (air flow) based on the ambient temperature measurement, the device temperature measurement, or both. This may involve increasing the speed of the fan 18 using the VFD 54 as the detected device temperature increases due to higher drive loads of the power devices 14 and/or increased ambient temperature.

In addition, varying the fan speed may include decreasing the speed of the fan 18 (or turning off the fan) using the VFD 54 as the detected device temperature decreases due to low use of the power devices 14 and/or decreased ambient temperature. If coolants are used in the heat sink 16 to cool the power devices 14, it is desirable and sometimes necessary to reduce the fan speed at very low ambient temperatures to keep the coolant viscosity within a desired operating range. Similarly, it is also desirable and sometimes necessary to reduce the fan speed at low ambient temperatures to keep the temperature of the power devices 14 within a desired operating range.

Figure 5:
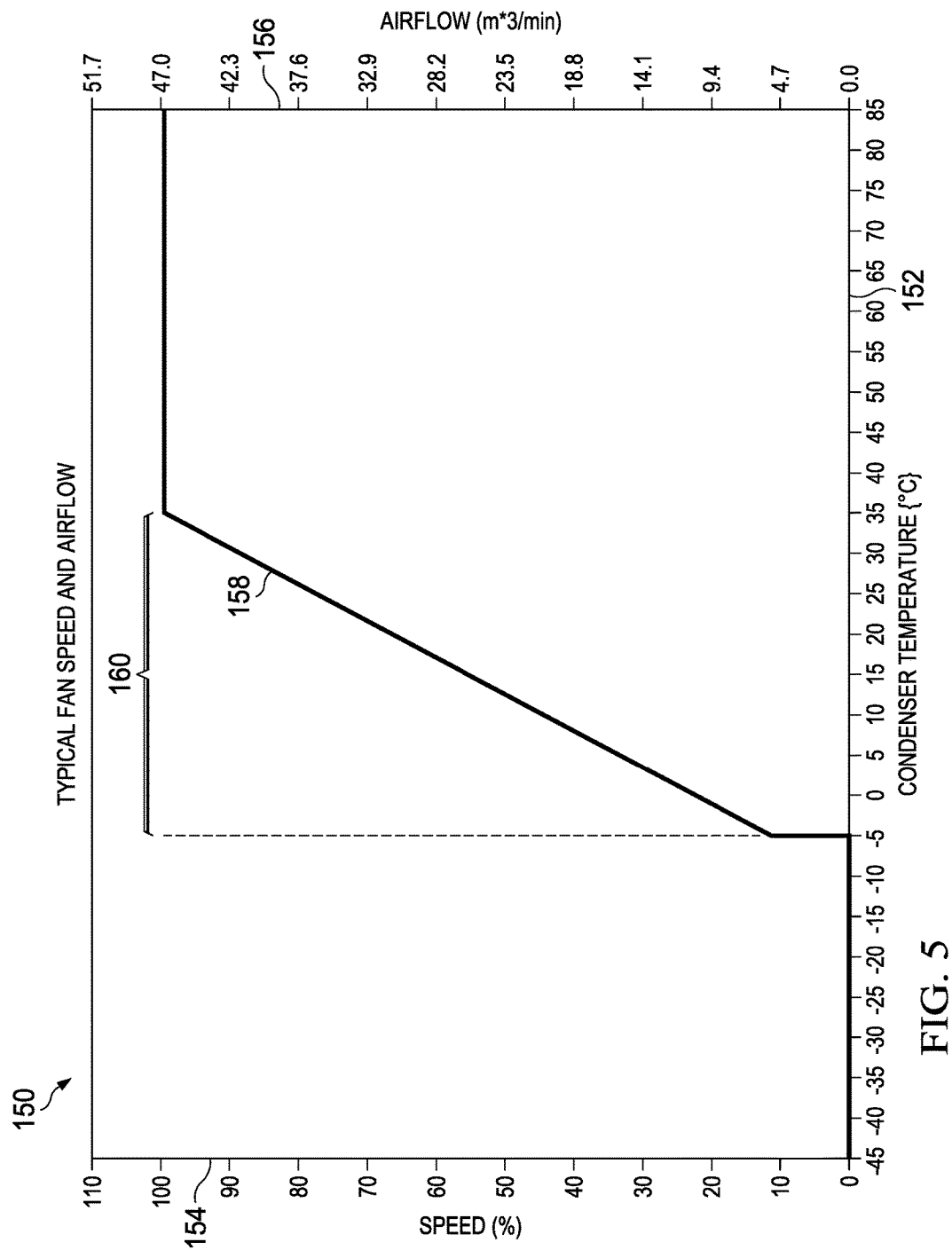
FIG. 5 is a plot illustrating a control scheme for varying a fan speed in the medium-voltage drive of FIG. 2, in accordance with an embodiment of the present disclosure.

As an example of this fan speed control, FIG. 5 provides a plot 150 representing a control scheme for the desired fan output based on a detected condenser temperature 152. The condenser temperature 152 may be equivalent or proportional to a device temperature. For example, the condenser temperature 152 may measure a temperature of coolant in a condenser that is used to cool the power devices 14 (e.g., via a fluid cooled heat sink 16). In other embodiments, the temperature relationship may vary the airflow (fan speed) based on a temperature detected by a temperature sensor 24 positioned directly at the heat sink 16 or devices 14, or based on the ambient temperature sensor 22.

FIG. 5 plots a line 158 representing the output fan speed 154 (as a percentage of highest available fan speed) and the resulting airflow 156 (in meters cubed per minute) through the cabinet 12 based on the detected temperature 152. The controller 52 may output signals to the VFD 54 to vary the fan speed 154 linearly within a certain temperature range 160. For example, the line 158 shows a linearly increasing fan speed 154 across the condenser temperature range of −5° C. to 35° C. Specifically, the fan speed 154 varies from 0% (i.e., the fan 18 is off) at −5° C. to 100% (i.e., fan operating full-speed) at 35° C. The fan 18 may remain off for all detected temperatures below −5° C. and full-speed for all detected temperatures above 35° C. It should be noted that the relationship of FIG. 5 is merely an example, and other control schemes for varying fan speed 154 based on detected temperatures 152 (or across different temperature ranges 160) may be used in other embodiments.

The linear control of the fan speed 154 with respect to the detected temperature 152 may be used to limit the fan speed 154 to only what is necessary for the current temperature conditions. That way, the control of the fan 18 may facilitate reduced intake of dust and other contaminants and reduced drive losses under low load or temperature conditions, as compared to existing systems that merely cycle a cooling fan between completely on and completely off. In other embodiments, the speed control may also be nonlinear.

Turning back to FIG. 4, the method 130 may further include steps to maintain the power devices 14 of the medium-voltage drive 10 within a desired operating temperature range during exposure to extremely cold ambient temperatures. At extremely low ambient temperatures, the controller 52 may output signals to incrementally increase power (block 138) to the space heaters 20 in the medium-voltage drive 10 in response to decreasing ambient temperatures. For example, the controller 52 may output signals to incrementally increase power (block 138) to the space heaters 20 when the detected ambient temperature dips below certain temperature thresholds. In some embodiments, the controller 52 may incrementally increase space heater power by turning on an additional space heater 20 disposed in the cabinet 12 each time the ambient temperature decreases below another temperature threshold. In other embodiments, the controller 52 may incrementally increase space heater power by turning one or more space heaters 20 from a low setting to a medium setting to a high setting each time the ambient temperature decreases below another threshold.

The method 130 may also include preventing the power devices 14 of the medium-voltage drive 10 from operating (block 140) until the detected device temperature reaches above a rated minimum operating temperature. For example, if the medium-voltage drive 10 has been off for some time period during extremely cold ambient temperatures, the controller 52 may output signals to the space heater controls 56 to increase the temperature inside the cabinet 12 until the device temperature (e.g., detected by sensor 24) is within an operating temperature range. The controller may also stop the drive if the temperature exceeds a desired maximum temperature.

Although the disclosure and its advantages have been described in detail, it should be understood that various changes, substitutions and alterations can be made herein without departing from the spirit and scope of the disclosure as defined by the following claims.

What is claimed is:

1. A medium-voltage drive system, comprising:
a medium-voltage drive comprising at least one cabinet and a plurality of power devices disposed in the cabinet;
a heat sink disposed in the cabinet and coupled to the plurality of power devices, wherein the heat sink comprises a liquid-cooled or two-phase heat sink having a coolant system that circulates coolant through the heat sink to cool the power devices;
at least one fan for moving air to cool the power devices, wherein the fan is positioned to move air directly over the heat sink to cool the power devices;
at least one space heater disposed in the cabinet;
at least one ambient sensor for detecting a temperature of ambient air;
at least one device sensor for detecting a temperature of the power devices;
at least one variable frequency drive (VFD) coupled to the at least one fan for varying the speed of the fan; and
a controller communicatively coupled to the ambient sensor, the device sensor, the VFD, and the at least one space heater, wherein the controller is configured to output control signals to adjust the fan speed and the heater power level of the at least one space heater based on feedback received from the ambient sensor and the device sensor, wherein the controller is configured to reduce the speed of the fan in response to the ambient temperature or the device temperature lowering below a threshold, thereby maintaining a viscosity of the coolant within a predetermined range by reducing the speed of the fan.

2. The system of claim 1, wherein the controller is configured to output control signals to adjust the heater power level of the at least one space heater by turning on an additional space heater in response to the temperature of ambient air dropping below a threshold.

3. The system of claim 1, wherein each space heater comprises a heater power control component for adjusting the heater power level of the space heater.

4. The system of claim 1, wherein the device sensor is disposed in the coolant system to detect the temperature of the power devices by measuring a temperature of coolant in the coolant system.

5. The system of claim 1, wherein the cabinet comprises as an outdoor unit.

6. The system of claim 1, wherein the ambient sensor and the device sensor both comprise resistance temperature detectors.

7. The system of claim 1, wherein the cabinet is divided into a first portion and a second portion, wherein the plurality of power devices are located in the first portion, wherein the heat sink is located in the second portion, and wherein the fan blows air through the second portion over the heat sink.

8. A method, comprising:
measuring an ambient temperature associated with a medium-voltage drive;
measuring a device temperature associated with one or more power devices in the medium-voltage drive;
cooling the one or more power devices via a heat sink disposed in the medium-voltage drive and coupled to the one or more power devices, wherein cooling the one or more power devices via the heat sink comprises circulating a coolant through the heat sink, wherein the heat sink is a liquid-cooled or two-phase heat sink;
blowing air directly over the heat sink in the medium-voltage drive;
adjusting, via a variable frequency drive, a speed of a fan based on the ambient temperature and the device temperature;
adjusting a heater power level of at least one space heater disposed in the medium-voltage drive based on the ambient temperature and the device temperature;
reducing the speed of the fan in response to the ambient temperature or the device temperature lowering below a threshold; and
maintaining a viscosity of the coolant within a predetermined range by reducing the speed of the fan.

9. The method of claim 8, further comprising incrementally increasing the heater power level of the at least one space heater as the ambient temperature drops below a threshold.

10. The method of claim 9, wherein increasing the heater power level comprises turning on an additional space heater.

11. The method of claim 9, wherein increasing the heater power level comprises increasing a current flowing through a heating element of the at least one space heater.

12. The method of claim 8, further comprising preventing the medium-voltage drive from operating the one or more power devices until the device temperature reaches an operating temperature threshold.

13. The method of claim 8, further comprising adjusting the speed of the fan with respect to the ambient temperature or the device temperature over a predetermined temperature range.

14. The method of claim 8, wherein measuring the device temperature comprises detecting a temperature of coolant flowing through a heat sink coupled to the at least one device.

15. The method of claim 8, wherein measuring the device temperature comprises measuring a temperature of the coolant being circulated through the heat sink to cool the one or more power devices.

16. A tangible, non-transitory, computer-readable medium comprising machine-readable instructions to:
    receive an ambient temperature measurement indicative of an ambient temperature associated with a medium-voltage drive;
    receive a device temperature measurement indicative of a temperature of one or more power devices in the medium-voltage drive;
    output a control signal to a variable frequency drive to adjust a speed of a fan blowing air directly over a liquid-cooled or two-phase heat sink attached to the one or more power devices based on the ambient temperature measurement and the device temperature measurement, wherein the control signal output to the variable frequency drive comprises a control signal to reduce a speed of the fan in response to the ambient temperature measurement or the device temperature measurement lowering below a threshold to maintain a viscosity of a coolant flowing through the liquid-cooled or two-phase heat sink within a predetermined range; and
    output a control signal to at least one space heater disposed in the medium-voltage drive to adjust a heater power level of the at least one space heater based on the ambient temperature measurement and the device temperature measurement.

17. The tangible, non-transitory, computer-readable medium of claim 16, further comprising instructions to:
    determine the control signal to output to the variable frequency drive based on a relationship between the fan speed and the ambient temperature measurement or the device temperature measurement over a predetermined temperature range.

* * * * *